United States Patent
Jain et al.

(10) Patent No.: US 10,439,053 B2
(45) Date of Patent: Oct. 8, 2019

(54) CASCODE HETEROJUNCTION BIPOLAR TRANSISTOR

(71) Applicant: GLOBALFOUNDRIES Inc., Grand Cayman (KY)

(72) Inventors: Vibhor Jain, Essex Junction, VT (US); Alvin J. Joseph, Williston, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/394,421

(22) Filed: Apr. 25, 2019

(65) Prior Publication Data

US 2019/0252530 A1   Aug. 15, 2019

Related U.S. Application Data

(62) Division of application No. 15/664,418, filed on Jul. 31, 2017.

(51) Int. Cl.
*H01L 29/737*   (2006.01)
*H01L 29/08*   (2006.01)
(Continued)

(52) U.S. Cl.
CPC .... *H01L 29/7378* (2013.01); *H01L 21/02532* (2013.01); *H01L 21/76895* (2013.01); *H01L 21/84* (2013.01); *H01L 23/535* (2013.01); *H01L 27/1203* (2013.01); *H01L 29/0649* (2013.01); *H01L 29/0817* (2013.01); *H01L 29/0821* (2013.01); *H01L 29/165* (2013.01); *H01L 29/66242* (2013.01)

(58) Field of Classification Search
CPC ............. H01L 29/7378; H01L 29/7371; H01L 29/66242; H01L 29/165; H01L 29/0821; H01L 29/0817; H01L 21/84; H01L 27/1203
See application file for complete search history.

(56) References Cited

U.S. PATENT DOCUMENTS

| 6,949,764 B2 | 9/2005 | Ning |
| 7,352,051 B2 | 4/2008 | Bromberger |

(Continued)

*Primary Examiner* — Marcos D. Pizarro
*Assistant Examiner* — Antonio B Crite
(74) *Attorney, Agent, or Firm* — Thompson Hine LLP; Anthony Canale

(57) ABSTRACT

Fabrication methods and device structures for heterojunction bipolar transistors. A first emitter of a first heterojunction bipolar transistor and a second collector of a second heterojunction bipolar transistor are formed in a device layer of a silicon-on-insulator substrate. A first base layer of a first heterojunction bipolar transistor is epitaxially grown on the device layer with an intrinsic base portion arranged on the first emitter. A first collector of the first heterojunction bipolar transistor is epitaxially grown on the intrinsic base portion of the first base layer. A second base layer of the second heterojunction bipolar transistor is epitaxially grown on the device layer with an intrinsic base portion arranged on the second collector. A second emitter of the second heterojunction bipolar transistor is epitaxially grown on the intrinsic base portion of the second base layer. A connection is formed between the first emitter and the second collector.

10 Claims, 7 Drawing Sheets

(51) Int. Cl.
*H01L 29/06* (2006.01)
*H01L 29/165* (2006.01)
*H01L 29/66* (2006.01)
*H01L 27/12* (2006.01)
*H01L 23/535* (2006.01)
*H01L 21/768* (2006.01)
*H01L 21/02* (2006.01)
*H01L 21/84* (2006.01)

(56) References Cited

U.S. PATENT DOCUMENTS

| | | |
|---|---|---|
| 7,598,539 B2 | 10/2009 | Wilhelm |
| 7,605,047 B2 | 10/2009 | Bromberger |
| 8,212,291 B2 | 7/2012 | Thrivikraman et al. |
| 8,288,758 B2 | 10/2012 | Ning et al. |
| 8,415,763 B2 | 4/2013 | Harame et al. |
| 8,441,084 B2 | 5/2013 | Cai et al. |
| 8,586,441 B1 | 11/2013 | Cai et al. |
| 8,697,532 B2 * | 4/2014 | Chen .................. H01L 27/0605 |
| | | 257/197 |
| 8,933,537 B2 | 1/2015 | Fox et al. |
| 9,318,585 B1 | 4/2016 | Cai et al. |
| 9,331,097 B2 | 5/2016 | Cai et al. |

* cited by examiner

US 10,439,053 B2

CASCODE HETEROJUNCTION BIPOLAR TRANSISTOR

BACKGROUND

The invention relates generally to semiconductor device and integrated circuit fabrication and, in particular, to fabrication methods and device structures for heterojunction bipolar transistors.

A bipolar junction transistor is a three-terminal electronic device that includes an emitter, an intrinsic base, and a collector in its construction. The intrinsic base is arranged between the emitter and collector in the structure of the device. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by a silicon-germanium (SiGe) alloy, which is characterized by a narrower band gap than silicon.

Improved fabrication methods and device structures for heterojunction bipolar transistors are needed.

SUMMARY

In an embodiment of the invention, a structure includes a first heterojunction bipolar transistor with a first emitter in a device layer of a silicon-on-insulator substrate, a first base layer with an intrinsic base portion arranged on the first emitter, and a first collector on the intrinsic base portion of the base layer. The intrinsic base portion of the first base layer is arranged in a vertical direction between the first emitter and the first collector. The structure further includes a second heterojunction bipolar transistor with a second collector in the device layer, a second base layer with an intrinsic base portion arranged on the second collector, and a second emitter on the intrinsic base portion of the base layer. The intrinsic base portion of the second base layer is arranged in the vertical direction between the second emitter and the second collector. The first emitter is coupled with the second collector, and the first emitter and the second collector each extend vertically in the device layer to a buried oxide layer of the silicon-on-insulator substrate.

In an embodiment of the invention, a method is provided for fabricating a structure using a device layer of a silicon-on-insulator substrate. The method includes forming a first emitter of a first heterojunction bipolar transistor and a second collector of a second heterojunction bipolar transistor in the device layer. The method further includes epitaxially growing a first base layer of a first heterojunction bipolar transistor on the device layer with an intrinsic base portion arranged on the first emitter, and epitaxially growing a first collector of the first heterojunction bipolar transistor on the intrinsic base portion of the first base layer. The method further includes epitaxially growing a second base layer of the second heterojunction bipolar transistor on the device layer with an intrinsic base portion arranged on the second collector, and epitaxially growing a second emitter of the second heterojunction bipolar transistor on the intrinsic base portion of the second base layer. The method further includes forming a connection between the first emitter and the second collector.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
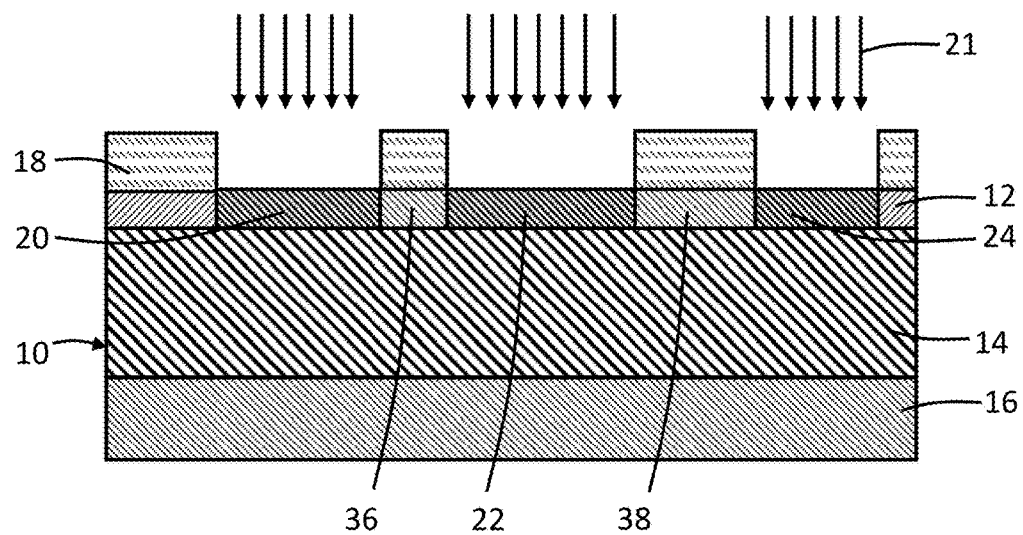
FIGS. 1-8 are cross-sectional views of a device structure at successive fabrication stages of a processing method in accordance with embodiments of the invention.
Figure 1A:
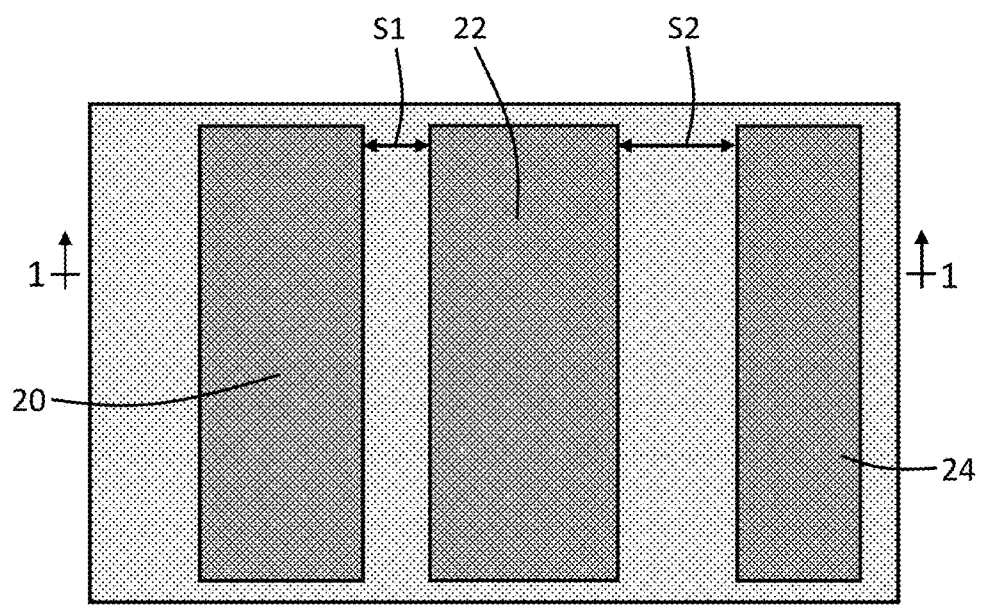
FIG. 1A is a top view of a device structure at an initial fabrication stage of a processing method and in which the block mask of FIG. 1 is removed for purposes of clarity of description.

With reference to FIGS. 1, 1A and in accordance with embodiments of the invention, a semiconductor substrate 10 may be a semiconductor-on-insulator (SOI) substrate that includes a device layer 12, a buried oxide (BOX) layer 14, and a handle wafer 16. The device layer 12 is separated from the handle wafer 16 by the intervening BOX layer 14 and is considerably thinner than the handle wafer 16. The device layer 12 is located on a top surface of the BOX layer 14 and is electrically insulated from the handle wafer 16 by the BOX layer 14. The BOX layer 14 may be comprised of an electrical insulator, such as silicon dioxide (e.g., $SiO_2$).

A block mask 18 is applied, and the device layer 12 is implanted with energetic ions, as diagrammatically indicated by the arrows 21, into its top surface to form doped regions 20, 22, 24. The trajectories of the ions penetrate into the semiconductor material of the device layer 12 to provide a depth profile that extends across the entire thickness of the device layer 12. The ions may be generated from a suitable source gas and implanted with selected implantation conditions using an ion implantation tool. The implantation conditions (e.g., ion species, dose, kinetic energy) may be selected to tune the electrical and physical characteristics (e.g., depth profile) of the doped regions 20, 22, 24. In an embodiment, the ions 21 may deliver a concentration of an n-type dopant from Group V of the Periodic Table (e.g., phosphorus (P) and/or arsenic (As)) that imparts n-type electrical conductivity to the constituent semiconductor material of the device layer 12.

The block mask 18 may be comprised of a layer of a light-sensitive material, such as an organic photoresist, applied by a spin coating process, pre-baked, exposed to light projected through a photomask, baked after exposure, and developed with a chemical developer. The block mask 18 has a thickness and a stopping power sufficient to block the masked areas of the device layer 12 against receiving a dose of the ions 21. The block mask 18 is stripped, as reflected in FIG. 1A, following the implantation.

The doped regions 20, 22, 24 may extend vertically over the entire thickness of the device layer 12 to the BOX layer 14 (i.e., the interface between the device layer 12 and the BOX layer 14). An emitter region 36 is arranged in the device layer 12 laterally between the doped region 20 and the doped region 22. A collector region 38 is arranged in the device layer 12 laterally between the doped region 22 and the doped region 24. The doped region 22 is laterally arranged between the emitter region 36 and the collector region 38 as a connecting link comprised of a section of the device layer 12 characterized by a reduced electrical resistivity due to the implantation. The emitter region 36 and the collector region 38 likewise may extend vertically over the entire thickness of the device layer 12 to the BOX layer 14 (i.e., the interface between the device layer 12 and the BOX layer 14).

Figure 2:
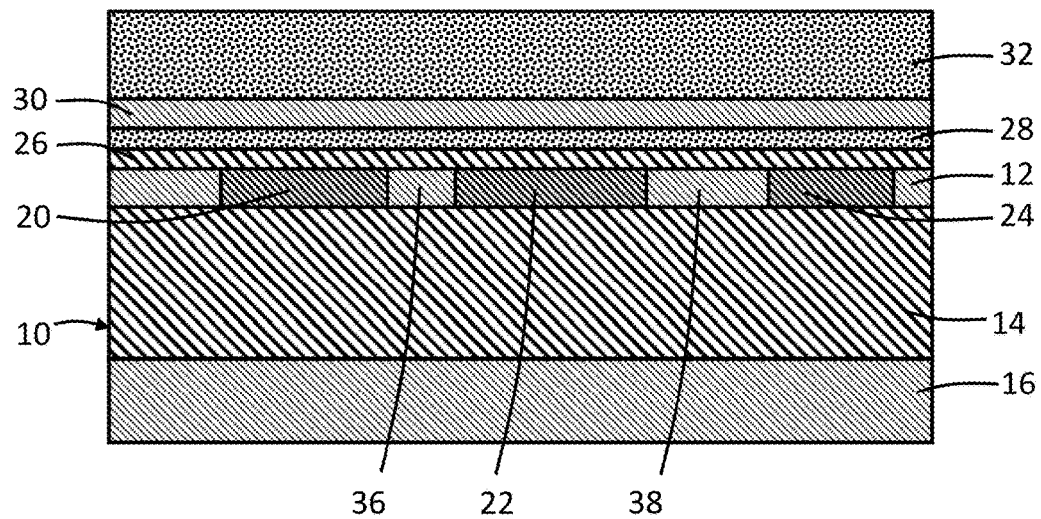

With reference to FIG. 2 in which like reference numerals refer to like features in FIGS. 1, 1A and at a subsequent fabrication stage of the processing method, a layer stack that includes non-conductor layers 26, 28, 30, 32 is applied on the device layer 12. The layers 26 and 28 may be composed of dielectric materials with etch selectivity to each other, and are located on a top surface of the device layer 12. Layer 26 may be composed of a dielectric material, such as silicon dioxide ($SiO_2$) grown by wet or dry oxidation of the device layer 12 or deposited by chemical vapor deposition (CVD). Layer 28 is formed on the top surface of the layer 26, and may be composed of a dielectric material, such as silicon nitride ($Si_3N_4$) deposited by CVD. Layer 30 may be composed of a semiconductor material, such as polycrystalline silicon (i.e., polysilicon) deposited by low-pressure chemical vapor deposition (LPCVD), and may include an electrically-active dopant that is introduced during deposition. In an embodiment, the layer 30 may be doped with a p-type dopant from Group III of the Periodic Table (e.g., boron (B)) that imparts p-type electrical conductivity to the constituent semiconductor material of the layer 30. The layer 32 is formed on the layer 30 and may be composed of a dielectric material, such as silicon dioxide ($SiO_2$) deposited by CVD In an alternative embodiment, the emitter region 36 and/or the collector region 38 may be doped to elevate the electrical conductivity of the constituent semiconductor material of the device layer 12. The semiconductor material of the emitter region 36 and/or the collector region 38, if doped, will have the same conductivity type as semiconductor material of the doped regions 20, 22, 24. For example, a block mask (not shown) may be applied to mask the doped regions 20, 22, 24, and the emitter region 36 and collector region 38 may both be implanted with ions delivering an n-type dopant from Group V of the Periodic Table (e.g., phosphorus (P) and/or arsenic (As)). The implantation conditions (e.g., ion species, dose, kinetic energy) may be selected to tune the electrical and physical characteristics (e.g., depth profile) of the emitter region 36 and collector region 38. For example, the emitter region 36 may be implanted to adjust the current gain (i.e., beta) of the associated bipolar junction transistor, and the collector region 38 may be implanted to adjust the breakdown voltage of the associated bipolar junction transistor.

The doped region 20 is separated from the doped region 22 by a spacing, S1. The spacing S1 determines the width of the emitter region 36. Similarly, the doped region 22 is separated from the doped region 24 by a spacing, S2. The spacing S2 determines the width of the collector region 38. These spacings may be used to control the bottom junctions and the properties of the transistors formed using the doped regions 20, 22, 24, as discussed herein.

Figure 3:
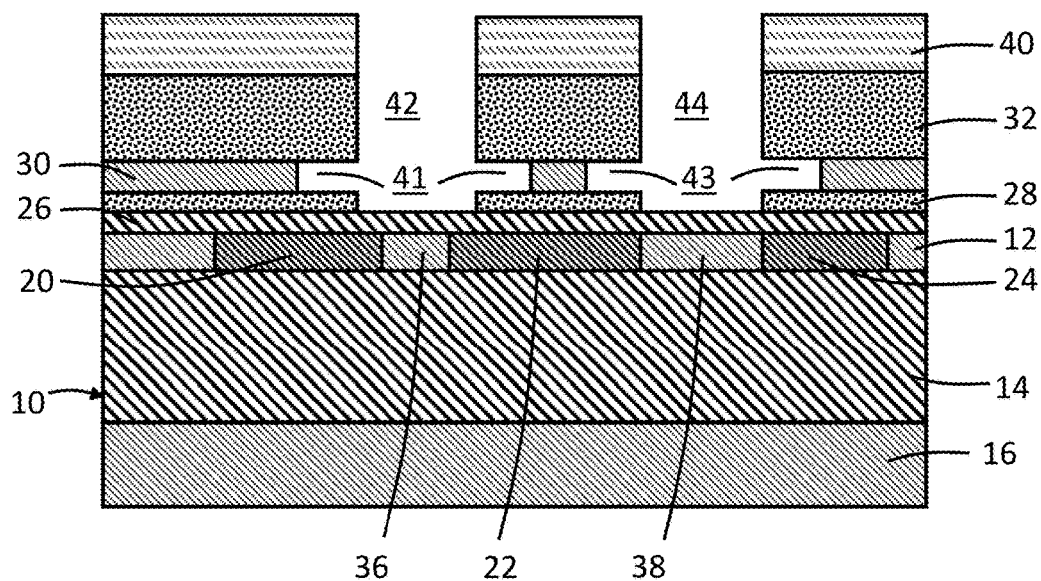

With reference to FIG. 3 in which like reference numerals refer to like features in FIG. 2 and at a subsequent fabrication stage of the processing method, an etch mask 40 is formed on the layer 32. The etch mask 40 may be composed of a layer of a light-sensitive material, such as an organic photoresist, applied by a spin coating process, pre-baked, exposed to light projected through a photomask, baked after exposure, and developed with a chemical developer. Openings 42, 44 may be formed in the layers 28, 30, 32 by one or more etching processes in which each etching process, which may be a reactive ion etching (RIE) process or a wet chemical process, is performed with a single etching step having an etch chemistry or multiple etching steps with different etch chemistries. The etching process extending the openings 42, 44 through layer 28 may stop on the layer 26.

The layer 30 is laterally recessed relative to the layers 28 and 32 using an isotropic etching process to form lateral extensions 41, 43 of the openings 42, 44. An isotropic etching process removes material in multiple directions (e.g., in lateral and vertical directions). The isotopic etching process may be either a dry etching process or a wet chemical etching process that etches the material of layer 30 selective to the materials of layers 26, 28, and 32. After the openings 42, 44 are formed and the layer 30 is laterally recessed to form the lateral extensions 41, 43, the etch mask 40 may be stripped by, for example, ashing.

Figure 4:
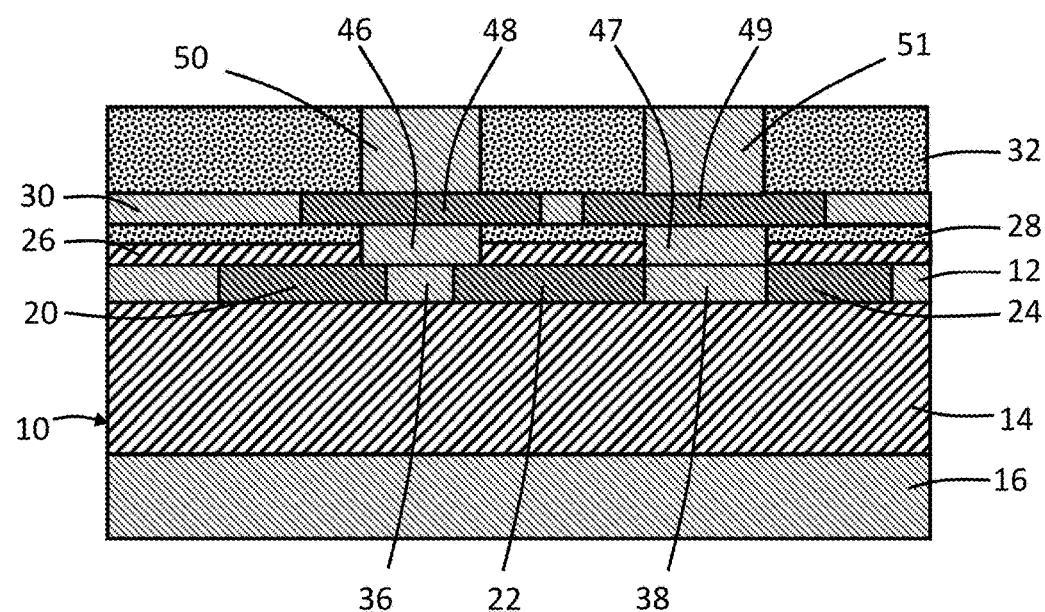

With reference to FIG. 4 in which like reference numerals refer to like features in FIG. 3 and at a subsequent fabrication stage of the processing method, a single crystal layer stack is formed inside each of the openings 42, 44 (FIG. 3), which operate to respectively self-align the respective layer stacks with the emitter region 36 and collector region 38 in the device layer 12. The layer stack inside opening 42 includes a link layer 46, a base layer 48, and a collector layer 50, and the layer stack inside opening 44 includes a link layer 47, a base layer 49, and an emitter layer 51. The link layer 46 is arranged vertically between the emitter region 36 and the base layer 48, and the base layer 48 is arranged vertically between the link layer 46 and the collector layer 50. The link layer 47 is arranged vertically between the collector region 38 and the base layer 49, and the base layer 49 is arranged vertically between the link layer 47 and the emitter layer 51.

The layers 46, 48, 50 inside opening 42 and the layers 47, 49, 51 inside opening 44 may be composed of semiconductor materials formed using an epitaxial growth process, such low temperature epitaxial grown with CVD, and each layer pair in the layer stacks may be concurrently formed by a single deposition process. The composition of the layer stacks may be modulated during epitaxial growth to produce the distinct layers 46, 48, 50 inside of the opening 42, and the distinct layers 47, 49, 51 inside of the opening 44. For example, base layer 48 and base layer 49 constituting one of the layer pairs in the respective layer stacks may have identical composition profiles achieved by growth modulation. The layer stacks may be formed by a selective epitaxial growth (SEG) process in which semiconductor material nucleates for epitaxial growth on semiconductor surfaces such as the single crystal semiconductor material of the device layer 12 in the emitter region 36 and the collector region 38, but does not nucleate for epitaxial growth from insulator surfaces, such as the top surface of the layer 32.

Figure 4A:
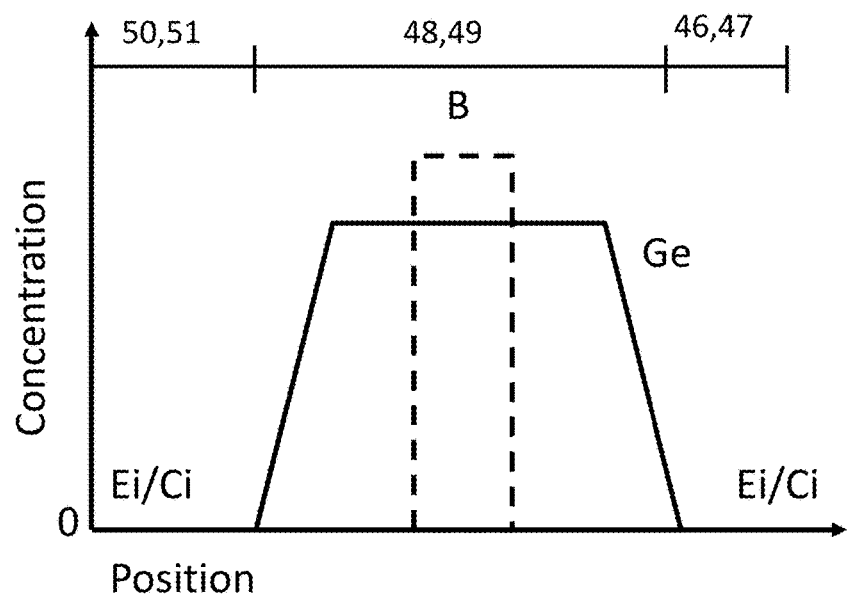
FIG. 4A is a diagrammatic view of the composition of the base layers in the device structure of FIG. 4.

The layers 48 and 49 have a different composition than the layers 46, 48 and the layers 50, 51. The base layers 48, 49 may be composed of single-crystal silicon-germanium (SiGe) in an alloy containing a peak content of germanium (Ge) ranging from 5 atomic percent to 50 atomic percent and, in the balance, a content of silicon (S1) ranging from 95 atomic percent to 50 atomic percent. The composition profile shared by the layer stacks is diagrammatically shown in FIG. 4A, in which the germanium (Ge) content is shown by the full line and the dopant (e.g., boron (B)) content is shown by the dashed line.

Germanium is absent in the composition of the layers 46, 48 in this layer pair (Ei/Ci) and the layers 50, 51 in this layer pair (Ei/Ci), and these layer pairs may be composed of silicon (Si). The germanium content of the base layers 48, 49 at the respective interfaces with link layers 46, 47 ramps upward (e.g., linearly increases) from a zero germanium content in layers 46, 47 (i.e., pure silicon) to a given germanium content, is maintained at a given germanium content over the thickness of the base layers 48, 49, and ramps downward (e.g., linearly decreases) from a given germanium content to a zero germanium content in layers 50, 51 (i.e., pure silicon). In the representative embodiment, the given germanium content over the thickness of the base layers 48, 49 may be constant at the peak germanium content. The profile for the germanium content is symmetrical within the base layers 48, 49, and has a trapezoidal shape.

The base layer 48 and the base layer 49 may be respectively doped to have an opposite conductivity type from the emitter region 36 and the collector region 38, if regions 36, 38 are doped. For example, the semiconductor material of the base layers 48, 49 may be doped with an electrically-active dopant, such as a p-type dopant (e.g., boron (B)) selected from Group III of the Periodic Table in a concentration that is effective to impart p-type conductivity. The dopant concentration in the base layers 48, 49, which is superimposed on the germanium content, is not uniform across their respective thicknesses. Instead, the dopant concentration in the base layers 48, 49 may be centralized in a central doped region over their layer thicknesses. The central doped region may be, for example, symmetrically located between the link layer 46 and the collector layer 50, and between the link layer 47 and the emitter layer 51. A partial layer thickness of the base layers 48, 49 is undoped between the central doped region and the respective interfaces with link layers 46, 47 and a partial layer thickness of the base layers 48, 49 is undoped between the central doped region and the respective interfaces with the collector layer 50 and emitter layer 51. The portions of the base layers 48, 49 that form in the lateral extensions 41, 43 (FIG. 3) of the openings 42, 44 may furnish extrinsic base regions that are later used in the process to contact the base layers 48, 49.

Figure 5:
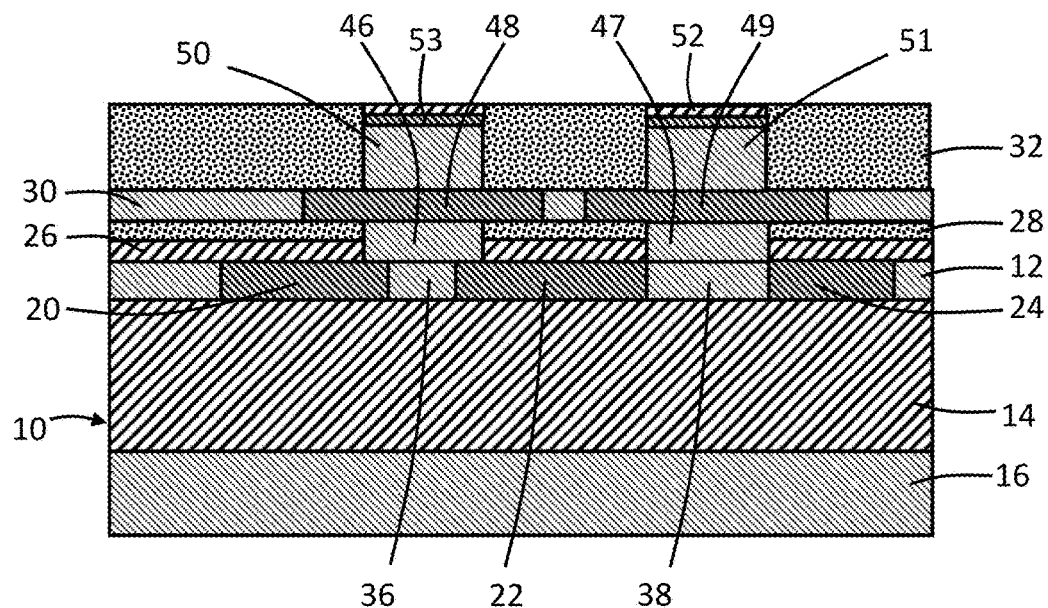

With reference to FIG. 5 in which like reference numerals refer to like features in FIG. 4 and at a subsequent fabrication stage of the processing method, dielectric layers 52 are respectively formed at the top surfaces of the collector layer 50 and emitter layer 51. In an embodiment, the dielectric layers 52 may be formed by oxidizing the semiconductor material constituting the collector layer 50 and emitter layer 51 with an oxidation process. The collector layer 50 and emitter layer 51 may both be implanted with ions delivering an n-type dopant from Group V of the Periodic Table (e.g., phosphorus (P) and/or arsenic (As)). The implantation conditions (e.g., ion species, dose, kinetic energy) may be selected to provide doped regions 53 that enhance the electrical conductivity of the collector layer 50 and emitter layer 51 at and near their respective top surfaces.

Figure 6:
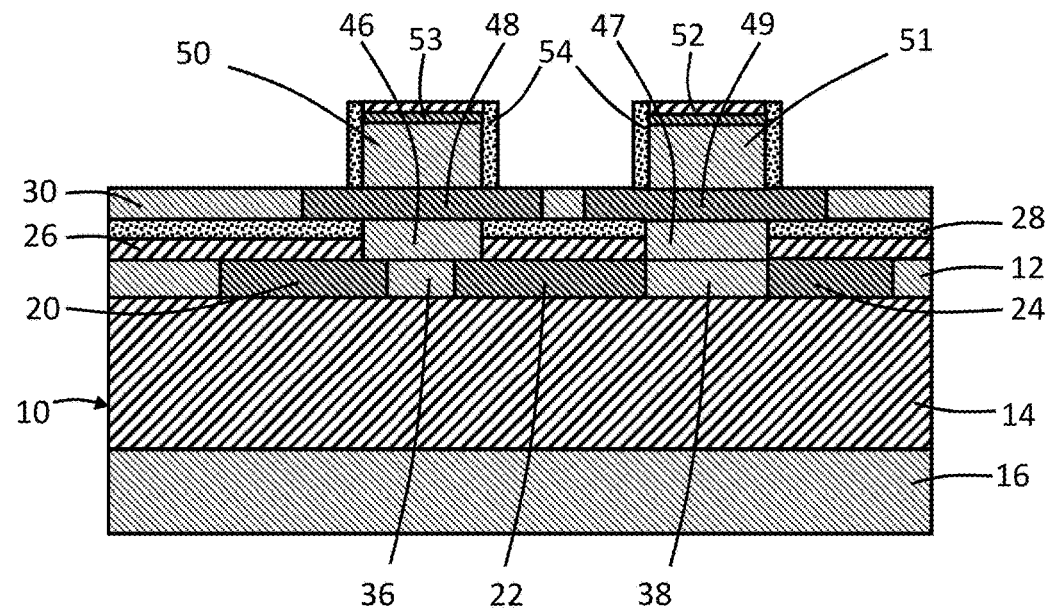

With reference to FIG. 6 in which like reference numerals refer to like features in FIG. 5 and at a subsequent fabrication stage of the processing method, spacers 54 are formed adjacent to the collector layer 50 and emitter layer 51. In an embodiment, the layer 32 may be removed by, for example, a wet chemical etch using a hot phosphoric acid, and a conformal nitride layer may be applied and anisotropically etched to form the spacers 54. In an alternative embodiment, an etch mask (not shown) may be applied and the layer 32 may be etched by an etching process selective to the dielectric layers 52 to form the spacers 54. The etching process may also remove the material of the layer 32 selective to the material of the layer 30. Alternatively, an additional layer of, for example, silicon dioxide may be formed between layer 30 and layer 32 in the layer stack including layers 26, 28, 30, 32 in order to provide etch selectivity.

Figure 7:
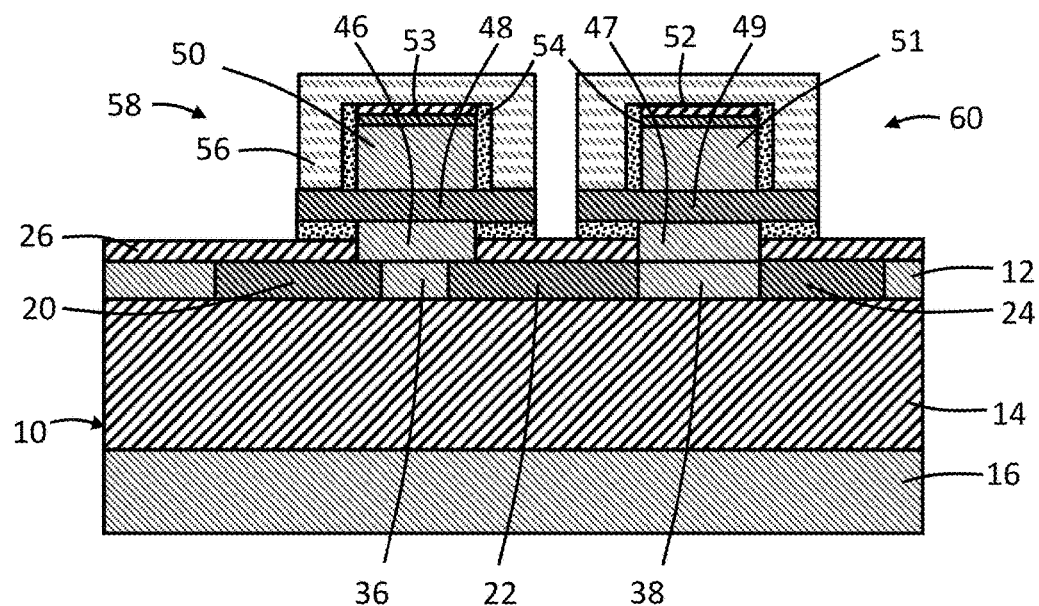

With reference to FIG. 7 in which like reference numerals refer to like features in FIG. 6 and at a subsequent fabrication stage of the processing method, an etch mask 56 is formed and an etching process is used to etch through the layers 28 and 30. The etching process is selective to the material of the layer 26, which operates as an etch stop. The etch mask 56 may be comprised of a layer of a light-sensitive material, such as an organic photoresist, applied by a spin coating process, pre-baked, exposed to light projected through a photomask, baked after exposure, and developed with a chemical developer. The etch mask 56 is stripped following the implantation. The layer 30 is separated into distinct sections that are associated with a collector-up transistor 58 and an emitter-up transistor 60. A portion of the doped region 24 is exposed between collector-up transistor 58 and emitter-up transistor 60 following the etching process.

The device structure of the collector-up transistor 58 is a heterojunction bipolar transistor characterized by a vertical architecture that includes a collector provided by the collector layer 50, an emitter provided by the emitter region 36 arranged in the device layer 12, and an intrinsic base provided by the base layer 48 located vertically between the emitter region 36 and collector layer 50. The base layer 48 adjoins the collector layer 50 along a p-n junction, and the emitter region 36 adjoins the base layer 48 along another p-n junction. The device structure of the collector-up transistor 58 can be divided into an intrinsic device region that includes the p-n junctions, and an extrinsic device region outside of the intrinsic device region. In the extrinsic device region, the doped region 20 provides a contact region coupled with the emitter region 36, and the extrinsic base section of the base layer 48 provides a contact region coupled with the intrinsic base section of the base layer 48.

The device structure of the emitter-up transistor 60 is a heterojunction bipolar transistor characterized by a vertical architecture that includes an emitter provided by the emitter layer 51, a collector provided by the collector region 38 arranged in the device layer 12, and an intrinsic base provided by the base layer 49 located vertically between the collector region 38 and the emitter layer 51. The base layer 49 adjoins the emitter layer 51 along a p-n junction, and the collector region 38 adjoins the base layer 49 along another p-n junction. The device structure of the emitter-up transistor 60 can be divided into an intrinsic device region that includes the p-n junctions, and an extrinsic device region outside of the intrinsic device region. In the extrinsic device region, the doped region 24 provides a contact region coupled with the collector region 38, and the extrinsic base section of the base layer 49 provides a contact region coupled with the intrinsic base section of the base layer 49.

The spacing between the doped regions 20, 22 (FIG. 1A) may be adjusted to control the properties of the collector-up transistor 58. Specifically, the spacing may be used to control the base-emitter capacitance and the transistor gain (i.e., beta). In an embodiment, an additional mask may be used for an ion implantation of the emitter region 36 in the device layer 12 in order to adjust the doping in the emitter region 36 and control the junction. The spacing between the doped regions 22, 24 (FIG. 1A) may be adjusted to control the properties of the emitter-up transistor 60. Specifically, the spacing may be used to control the collector-base capacitance and the breakdown voltage. In an embodiment, an additional mask may be used for an ion implantation of the collector region 38 in the device layer 12 in order to adjust the doping in the collector region 38 and control the junction.

Figure 8:
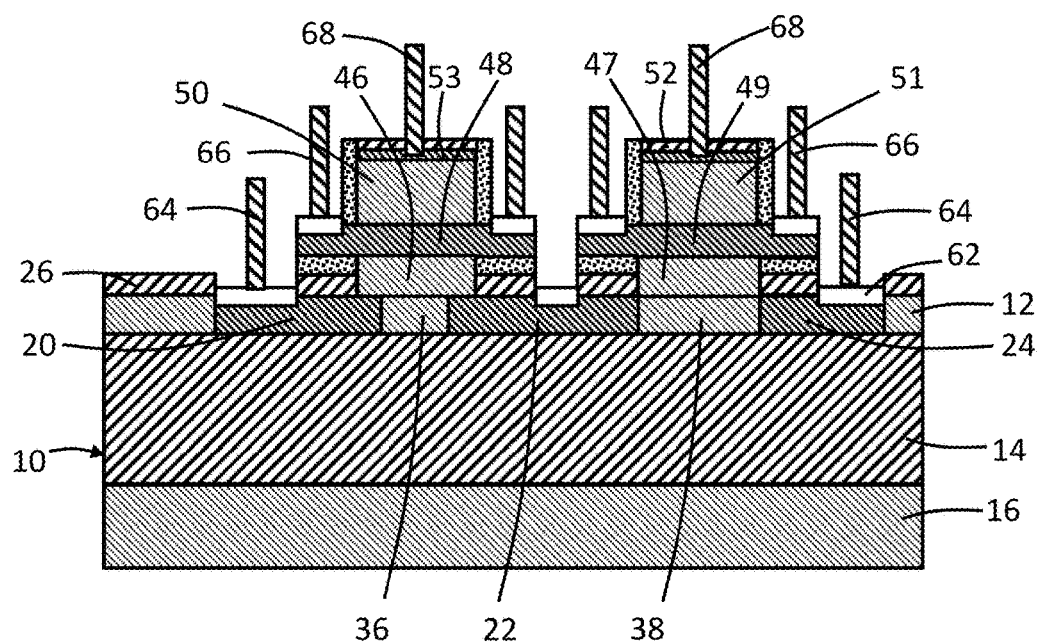

With reference to FIG. 8 in which like reference numerals refer to like features in FIG. 7 and at a subsequent fabrication stage of the processing method, sections of a silicide layer 62 are formed at the respective top surfaces of the doped regions 20 and 24, and at the respective top surfaces of the extrinsic base sections of the base layers 48, 49. A section of the silicide layer 62 is also formed at the top surface of the portion of the doped region 22 that is exposed between the collector-up transistor 58 and the emitter-up transistor 60. The sections of the silicide layer 62 may be simultaneously formed by a silicidation process that involves one or more annealing steps to form a silicide phase by reacting a layer of silicide-forming metal and the semiconductor material contacting the silicide-forming metal.

The emitter region 36 and the collector region 38 are connected (i.e., shorted) by the doped region 22 in the device layer 12. The section of the silicide layer 62 in the doped region 22 may enhance the electrical conductivity of the connection between the regions 36, 38. The transistors 58, 60 are connected in a configuration that is amenable to use in a cascode type circuit, and that may be placed on a single chip that further includes a transistor-based switch.

Middle-of-line (MOL) processing and back-end-of-line (BEOL) processing follow, which includes formation of contacts and wiring for a local interconnect structure, and formation of dielectric layers, via plugs, and wiring for a BEOL interconnect structure coupled by the local interconnect structure with the collector-up transistor 58 and emitter-up transistor 60.

Contacts 64, 66, 68 may be formed as conductive features of a local interconnect structure for the collector-up transistor 58 and the emitter-up transistor 60. For the collector-up transistor 58, one or more contacts 64 are aligned with the contact region provided by the doped region 20 and with the contact region provided by the doped region 24, one or more contacts 66 are aligned with a portion of the base layer 48 that is outside of the footprint of the collector layer 50 and its spacers 54, and one or more contacts 68 are aligned with the collector layer 50. For the emitter-up transistor 60, one or more contacts 64 are aligned with the contact region provided by the doped region 24, one or more contacts 66 are aligned with a portion of the base layer 49 that is outside of the footprint of the emitter layer 51 and its spacers 54, and one or more contacts 68 are aligned with the emitter layer 51. Each set of one or more contacts 64, 66, 68 may comprise an array of vias that are arranged with a given pitch.

Figure 10:
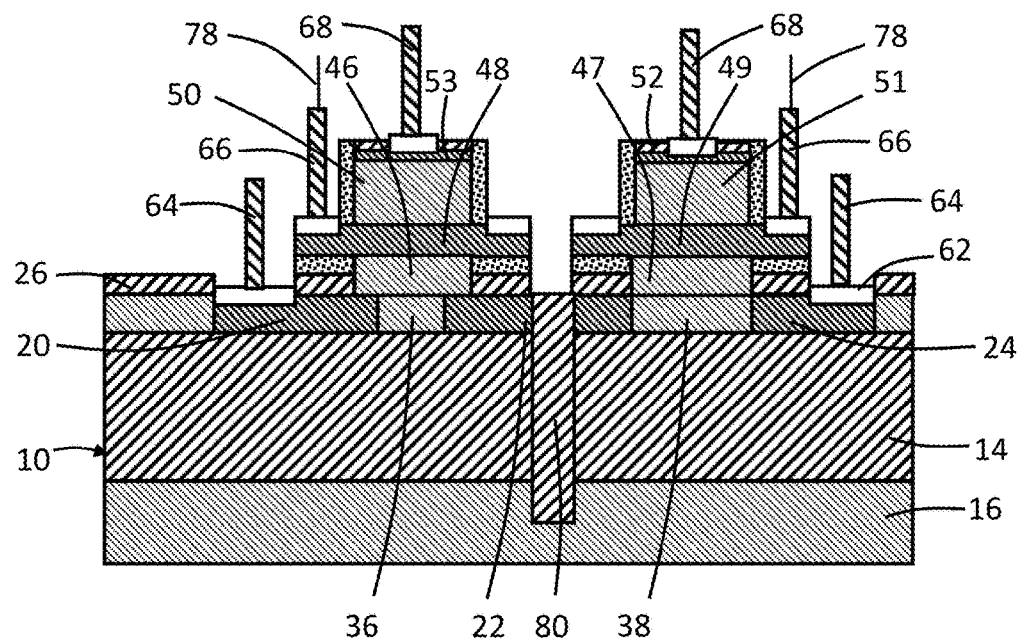
FIG. 10 is a cross-sectional view of a device structure in accordance with embodiments of the invention.

In an alternative embodiment and as shown in FIG. 10, the contacts 66 may only be included on one side or the other of the portion of the base layer 48 defining the extrinsic base of the collector-up transistor 58. In an alternative embodiment and as also shown in FIG. 10, the contacts 66 may only be included on one side or the other of the portion of the base layer 49 defining the extrinsic base of the emitter-up transistor 60.

The contacts 64, 66, 68 are arranged in an interlayer dielectric layer (not shown), which may be composed of silicon dioxide ($SiO_2$), silicon nitride ($Si_3N_4$), fluorine-doped silicon dioxide, or a combination of these and other dielectric materials. The contacts 64, 66, 68 may be composed of a conductive material, such as tungsten, deposited in openings defined in the interlayer dielectric layer by photolithography and etching processes. The contacts 64, 66, 68 may be connected with additional conductive features, such as wires (not shown), arranged in the dielectric layer and composed of a conductive material, such as copper (Cu).

Figure 9:
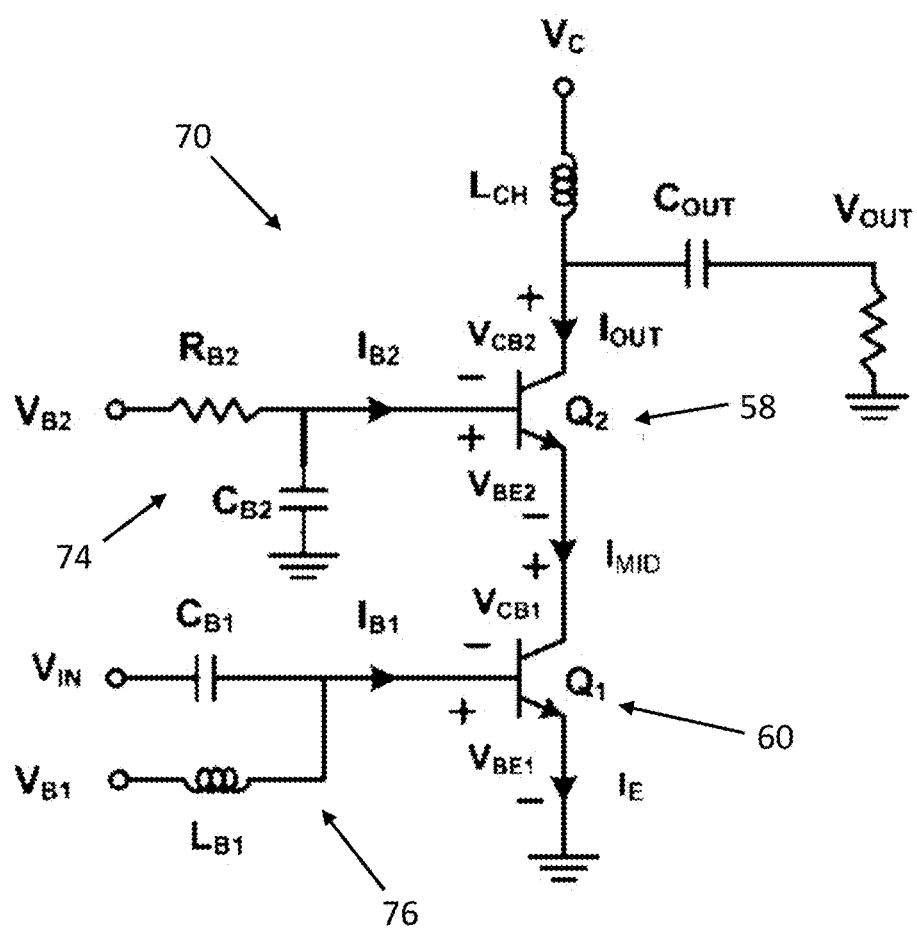
FIG. 9 is an electrical circuit formed using the device structure of FIG. 8.

With reference to FIG. 9 in which like reference numerals refer to like features in FIG. 8, the collector-up transistor 58 and the emitter-up transistor 60 may be arranged as structural elements in a cascode amplifier circuit 70. The collector-up transistor 58 (Q2) operates as a common base source in an output stage of the cascode amplifier circuit 70, and the emitter-up transistor 60 (Q1) operates as a common gate source in an input stage of the cascode amplifier circuit 70. The cascode amplifier circuit 70 further includes a bias circuit 74 coupled with the base layer 48 of the collector-up transistor 58, a bias circuit 76 coupled with the base layer 49 of the emitter-up transistor 60, and various coupling capacitors and inductors. An input signal Vin is directed into the cascode amplifier circuit 70 at the base layer 48 of the collector-up transistor 58 and is output from the cascode amplifier circuit 70 at the collector region 38 of the emitter-up transistor 60 as an output signal Vout.

Figure 11:
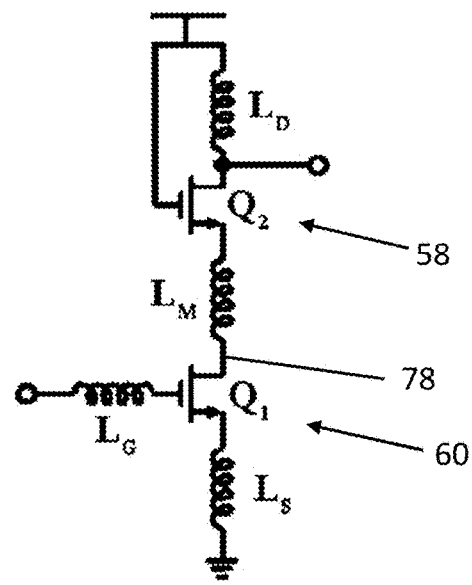
FIG. 11 is an electrical circuit formed using the device structure of FIG. 10.

With reference to FIGS. 10, 11 and in accordance with alternative embodiments, a cascode amplifier circuit 72 includes an arrangement in which the base layer 48 of the collector-up transistor 58 is electrically isolated from the base layer 49 of the emitter-up transistor 60. To that end, an isolation region 80 may be formed that penetrates through the doped region 22 in the device layer 12 and the BOX layer 14, and into the handle wafer 16 beneath the BOX layer 14. The isolation region 80 is formed by etching a trench through the device layer 12 and the BOX layer 14 and to a given depth into the handle wafer 16, and filling the trench with a dielectric material, such as silicon dioxide ($SiO_2$). A connection 78 may be provided by conductive features in the interconnect structure to couple the contact 64 connected with the base layer 48 with the contact 64 connected with the base layer 49, and permits additional passive circuit elements, such as the inductor in the cascode amplifier circuit 72, to be connected between the base layer 48 of the collector-up transistor 58 and the base layer 49 of the emitter-up transistor 60. The isolation relation is also arranged between the emitter region 36 and the collector region 38, which necessitates relying on one or more conductive features in the interconnect structure to couple the emitter region 36 with the collector region 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a structure using a device layer of a silicon-on-insulator substrate, the method comprising:
    forming a first emitter of a first heterojunction bipolar transistor and a second collector of a second heterojunction bipolar transistor in the device layer;
    epitaxially growing a first base layer of the first heterojunction bipolar transistor on the device layer with an intrinsic base portion arranged on the first emitter;
    epitaxially growing a first collector of the first heterojunction bipolar transistor on the intrinsic base portion of the first base layer;
    epitaxially growing a second base layer of the second heterojunction bipolar transistor on the device layer with an intrinsic base portion arranged on the second collector;
    epitaxially growing a second emitter of the second heterojunction bipolar transistor on the intrinsic base portion of the second base layer; and
    forming a connection between the first emitter and the second collector.

2. The method of claim 1 wherein the first base layer is composed of silicon-germanium epitaxially grown with a first profile of germanium content, and the second base layer is composed of silicon-germanium epitaxially grown with a second profile of germanium content that is equal to the first profile of germanium content.

3. The method of claim 1 wherein forming the connection between the second emitter and the first collector comprises:
    forming a doped region in the device layer,
    wherein the doped region is arranged in the device layer to couple the first emitter with the second collector.

4. The method of claim 3 wherein forming the connection between the first emitter and the second collector further comprises:
    siliciding at least a section of the doped region between the first emitter and the second collector.

5. The method of claim 1 further comprising:
    forming a dielectric isolation region that penetrates through the device layer and that is arranged between the first emitter and the second collector.

6. The method of claim 5 wherein forming the connection between the first emitter and the second collector further comprises:
    forming an interconnect structure that includes one or more conductive features connecting the first emitter with the second collector.

7. The method of claim 1 further comprising:
    implanting the device layer to form a first doped region and a second doped region separated by a spacing equal to a dimension of the first emitter or to a dimension of the second collector.

8. The method of claim 7 wherein the second doped region is arranged in the device layer to couple the first emitter with the second collector.

9. The method of claim 1 further comprising:
    depositing a plurality of non-conductor layers on the device layer; and
    forming a first opening in the non-conductor layers that is aligned with the first emitter,
    wherein the first base layer and the first collector are epitaxially grown inside the first opening.

10. The method of claim 9 further comprising:
    forming a second opening in the non-conductor layers that is aligned with the second collector,
    wherein the second base layer and the second emitter are epitaxially grown inside the second opening.

* * * * *